United States Patent
Rotondaro et al.

(10) Patent No.: US 6,787,425 B1
(45) Date of Patent: Sep. 7, 2004

(54) METHODS FOR FABRICATING TRANSISTOR GATE STRUCTURES

(75) Inventors: Antonio Luis Pacheco Rotondaro, Dallas, TX (US); Trace Quentin Hurd, Plano, TX (US); Stephanie Watts Butler, Richardson, TX (US); Majid M. Mansoori, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/462,409

(22) Filed: Jun. 16, 2003

(51) Int. Cl.[7] ............................................ H01L 21/336

(52) U.S. Cl. ...................................... 438/300; 438/682

(58) Field of Search ................................. 438/300, 592, 438/595, 655, 682, 685

(56) References Cited

U.S. PATENT DOCUMENTS

| | | | |
|---|---|---|---|
| 5,902,125 A | 5/1999 | Wu | |
| 6,265,272 B1 | 7/2001 | Chen | |
| 6,335,251 B2 | 1/2002 | Miyano et al. | |
| 6,444,529 B2 | 9/2002 | Ahmad et al. | |
| 6,518,155 B1 * | 2/2003 | Chau et al. | |

* cited by examiner

Primary Examiner—Phuc T. Dang
(74) Attorney, Agent, or Firm—Yingsheng Tung; Wade James Brady, III; Frederick J. Telecky, Jr.

(57) ABSTRACT

Methods are presented for fabricating MOS transistors, in which a sacrificial material such as silicon germanium is formed over a gate contact material prior to gate patterning. The sacrificial material is then removed following sidewall spacer formation to provide a recess at the top of the gate structure. The recess provides space for optional epitaxial silicon formation and suicide formation over the gate contact material without overflowing the tops of the sidewall spacers to minimize shorting between the gate and the source/drains in the finished transistor.

15 Claims, 7 Drawing Sheets

METHODS FOR FABRICATING TRANSISTOR GATE STRUCTURES

FIELD OF INVENTION

The present invention relates generally to semiconductor device manufacturing and more particularly to methods for fabrication of transistor gate structures.

BACKGROUND OF THE INVENTION

MOS transistors are found in many modern semiconductor products where switching and/or amplification functions are needed. Many manufacturing processes and techniques have been developed for fabricating MOS devices in semiconductor substrate materials such as silicon and the like. In recent years, the size of transistors and other components have steadily decreased to submicron levels in order to facilitate higher device densities in semiconductor products, wherein current design targets involve feature sizes in the sub-100 nm range. At the same time, many new applications have created a need to operate transistors and other semiconductor devices at lower power and voltage levels. In addition, switching speed requirements of MOS transistors continue to increase in order to facilitate faster and improved product performance. Accordingly, efforts continue to be made to design semiconductor devices, such as MOSFET transistors, which occupy less physical space, consume less power, and operate at higher switching speeds and at lower voltages.

MOS transistors include a conductive gate overlying a channel region of a semiconductor substrate with a thin gate dielectric, typically oxide, therebetween. Source and drain regions of the substrate (sometimes referred to as junction regions) are doped with impurities on opposite sides of the channel, wherein the source/drain regions of NMOS devices are doped with n-type impurities (e.g., As, Sb, P, etc.) and PMOS devices are doped using p-type impurities (e.g., B, Ga, In, etc.). The source and drain dopants are typically implanted into the silicon substrate using ion implantation systems, wherein the dosage and energy of the implanted ions may be varied depending upon the desired dopant concentration, depth, and profile. The ion dosage generally controls the concentration of implanted ions for a given semiconductor material, and the energy level of the beam ions determines the distance of penetration or depth of the implanted ions (e.g., the junction depth).

Electrical connections are typically made to transistor gate structures and source/drain regions of the substrate by forming silicide structures thereover. Sidewall spacers are typically formed along the lateral sidewalls of the gate structures to prevent shorting of the gate silicide to the source/drain silicide. Interlayer or interlevel dielectric (ILD) material is then formed over the wafer, through which vias are etched and filled with conductive material (e.g., tungsten, copper, or the like) to provide electrical contact connections to the gate and source/drain silicide structures. Interconnection of the various devices in the wafer is then accomplished by forming: a multi-level interconnect network in dielectric layers formed over the electrical devices, by which the device active elements are connected to other devices to create the desired circuits in the finished integrated circuit. In forming the silicide structures and subsequent conductive contacts, it is desirable to minimize the likelihood of short-circuits between the source/drain and the transistor gate. Accordingly, there is a need for improved transistor fabrication techniques by which process margins for contact formation can be maximized to reduce the probability of such short circuits in the manufacture of semiconductor products.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented hereinafter.

The inventors have appreciated that forming silicide over sub-100 nm gate structures sometimes results in volume, expansion of the resulting conductive suicide beyond the sidewall spacers, referred to herein as silicide "bread-loafing". This situation can reduce the process margins for forming source/drain contacts to avoid shorting to the gate. In addition, where the gate contact material is polysilicon, certain fabrication process flows provide for growth of epitaxial silicon over the gate polysilicon prior to silicidation of the gate contact. In this situation, the inventors have found that the epitaxial silicon itself may form above and laterally outward from the tops of the gate sidewall spacers, referred to hereinafter as polysilicon "mushrooming". The outward growth of the epitaxial silicon reduces the source/drain contact formation process margins, and subsequent silicide bread-loafing further worsens the situation. The invention provides transistor fabrication techniques which may be employed to combat silicide bread-loafing and polysilicon mushrooming effects during the manufacture of semiconductor products by providing a recess at the top of a patterned gate structure in which silicide and/or epitaxial silicon is formed. This, in turn, advantageously mitigates or avoids the process margin reduction seen in prior fabrication processes, and may thus reduce the likelihood of source/drain contacts shorting to the transistor gate and facilitate scaling of feature sizes in semiconductor products.

In accordance with the present invention, a method is provided for fabricating MOS transistors, in which a gate dielectric layer and a polysilicon or other gate contact layer are formed over a channel region of a semiconductor body. The method provides for formation of a sacrificial material, such as silicon germanium (SiGe) over the polysilicon layer, patterning of the sacrificial material and the polysilicon layer to define a gate structure, and formation of sidewall spacers along the gate structure sidewalls. The sacrificial material is then removed from the patterned gate structure, thus exposing the polysilicon gate contact and providing a recess in the gate structure between upper ends of the sidewall spacers. Thereafter, an epitaxial silicon may be formed in the recess, and the gate may then be implanted with dopants. A suicide is then formed over the epitaxial silicon or the polysilicon within the recess, where the thickness of the sacrificial material may be formed to correspond to the silicide thickness or to the combined thicknesses of the epitaxial silicon material and the silicide structure. In this way, the formation of the silicide structure substantially fills the recess of the gate structure without bread-loafing.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the attached drawings, wherein like reference numerals are used to refer to like elements throughout. The invention provides techniques for fabricating transistors which are described hereinafter in the context of various exemplary semiconductor devices, wherein the illustrated examples are not necessarily drawn to scale.

Figure 4A:
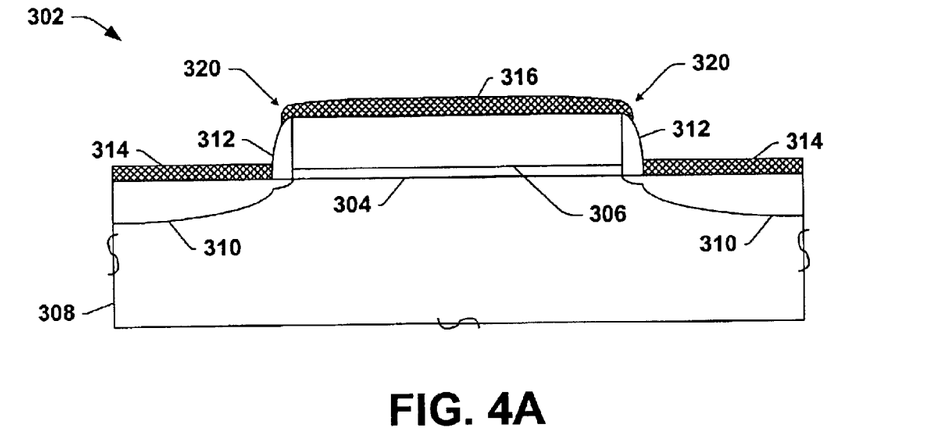
FIG. 4A is a partial side elevation view in section illustrating silicide volume expansion or bread-loafing at the top of a transistor gate structure.
Figure 4B:
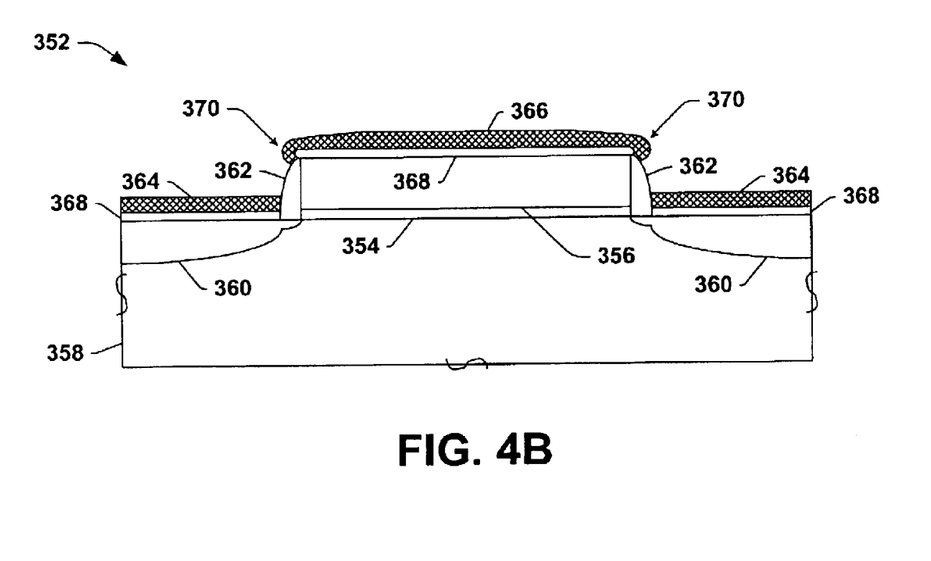
FIG. 4B is a partial side elevation view in section illustrating polysilicon mushrooming and silicide bread-loafing at the top of a transistor gate structure.

Referring initially to FIGS. 4A and 4B, examples of silicide bread-loafing and polysilicon mushrooming effects are illustrated to facilitate an understanding of the advantages possible with the present invention. In FIG. 4A, a transistor 302 is illustrated, having a thin gate dielectric 304 and a polysilicon gate contact 306 overlying a channel region of a silicon semiconductor body 308, with doped source/drain regions 310 formed in the silicon 308 on laterally opposite sides of the channel. Sidewall spacers 312 are formed along the gate structure sidewalls of the polysilicon 306 and the gate dielectric 304 of material that ideally does not react with nickel or cobalt in a silicide process. A metal, such as nickel (Ni) or cobalt (Co) is then formed over the wafer and a thermal process is employed to react the upper portions of the gate polysilicon 306 and the source/drain substrate regions 310 with the metal to form a gate silicide structure 316 and silicide source/drain structures 314. An etch process is subsequently used to remove the remaining unreacted nickel or cobalt, after which interconnect layers are formed over the device 302. As seen in the device 302 of FIG. 4A, however, volumetric expansion causes the gate silicide 316 to extend laterally beyond the sidewall spacers 312 at the lateral ends 320 of the silicide 316, resulting in reduced process margins for forming source/drain contacts to avoid shorting to the gate.

FIG. 4B illustrates another device 352 having a thin gate dielectric 354 and a polysilicon gate contact 356 overlying a channel region of a silicon substrate 358, as well as doped source/drain regions 360 and sidewall spacers 362 formed along the gate structure sidewalls of the polysilicon 356 and the gate dielectric 354. Following formation of the sidewall spacers 362, an epitaxial silicon material 368 is grown over the gate polysilicon 356 and the source/drain regions 360 of the substrate 358. The epitaxial silicon 368 in the device 352 expands or mushrooms above and laterally outward from the tops of the gate sidewall spacers 362 at the ends 370 thereof. The subsequent formation of silicide structures 364 and 366 exacerbates the process margin reduction, wherein the gate silicide 366 forms laterally outward (bread-loafing) at the ends 370.

Figure 1:
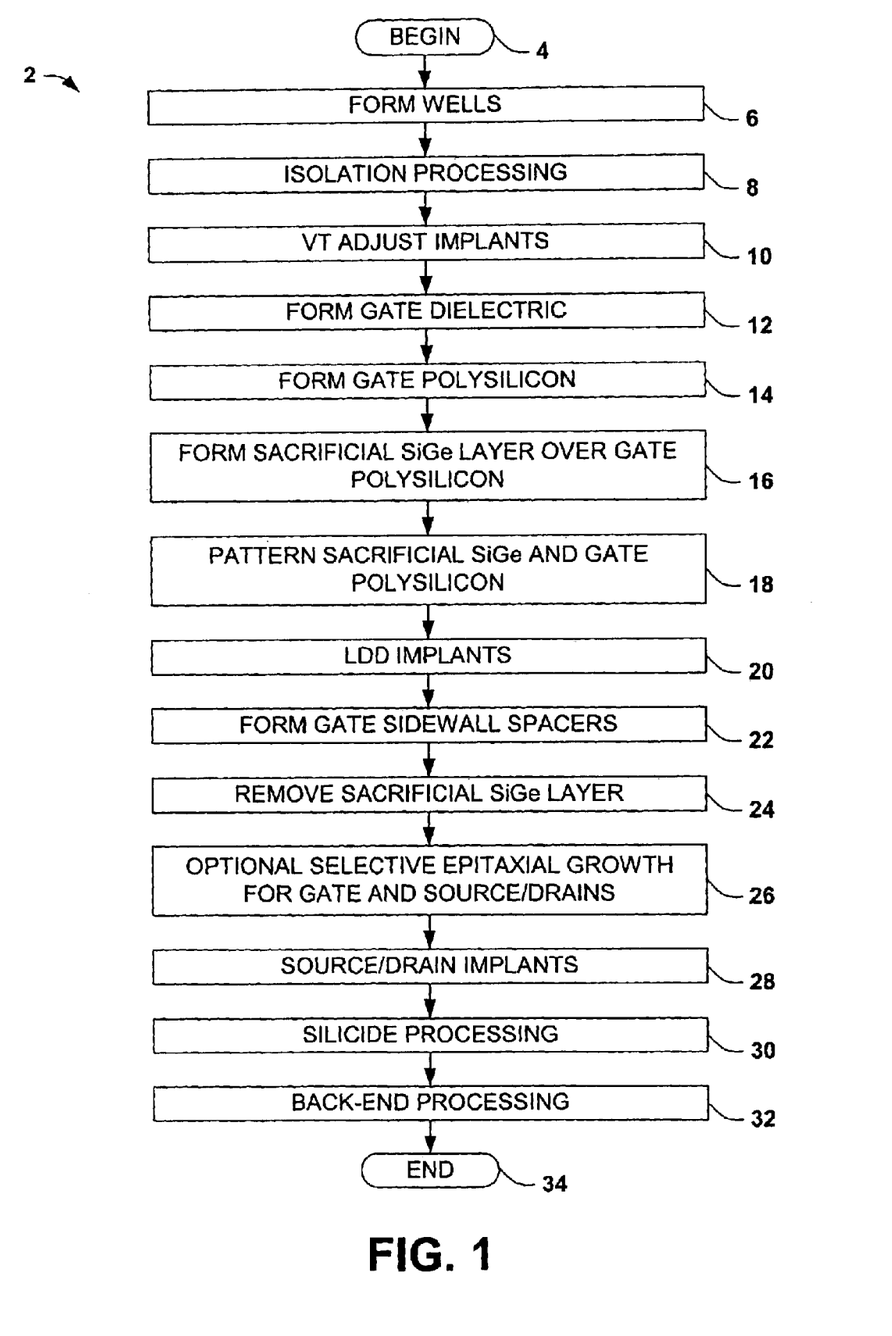
FIG. 1 is a flow diagram illustrating an exemplary method of fabricating MOS transistors in accordance with the present invention.

FIG. 1 illustrates an exemplary method 2 for fabricating MOS transistors in accordance with the present invention, which may be advantageously employed to reduce or mitigate gate suicide bread-loafing and polysilicon mushrooming effects during transistor device fabrication. Although the exemplary method 2 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated. For example, the method 2 may be employed in fabricating the exemplary transistor devices 102 and 202 as illustrated and described below with respect to FIGS. 2A–2H and 3A–3F, respectively.

Beginning at 4, any required wells are formed in a semiconductor body at 6 using any suitable well formation techniques, wherein the invention may be practiced in any type of semiconductor body, including but not limited to silicon substrates, SOI wafers, and wafers with an epitaxial silicon layer formed over a silicon substrate. Isolation processing is then performed at 8 including formation of device isolation structures, for example, using local oxidation of silicon (LOCOS) or shallow trench isolation (STI) techniques to provide electrical insulation between prospective active regions of the wafer. At 10, threshold voltage adjust implants may be performed to provide an initial concentration of dopants into active portions of the semiconductor body before a gate structure is formed at 12–18.

At 12, a gate dielectric layer is formed over a channel region of the semiconductor body using any suitable techniques. In one example, the wafer temperature is elevated in an oxidizing ambient, wherein the surface of the semiconductor body is oxidized to form a thin gate oxide layer of silicon dioxide ($SiO_2$) to any desired thickness. Other process steps may be employed to form a gate dielectric that may be a single material or a stack or multi-layer gate dielectric structure in accordance with the invention. At 14, a polysilicon layer or other conductive gate contact material is formed over the gate dielectric to any suitable thickness, wherein the gate contact layer may be a multi-layer stack or a single layer within the scope of the invention. In one example, polysilicon is deposited over the wafer using a chemical vapor deposition (CVD) process although other techniques may be employed at 14 within the scope of the invention.

A sacrificial material, such as silicon germanium (SiGe), is then formed at 16 over the polysilicon layer to any desired thickness. In one example illustrated and described below with respect to FIGS. 2A–2H, the sacrificial material comprises about 15–30% germanium, such as about 20% germanium, deposited using a CVD process. It is noted that where SiGe is used as the sacrificial material, a single CVD process may be employed at 14 and 16 to form the polysilicon gate contact material, where germanium is added to the CVD process to form the sacrificial material at 16. In one exemplary implementation, the sacrificial material is formed at 16 to a thickness generally corresponding to a thickness of the subsequently formed silicide structure. In another example illustrated below in FIGS. 3A–3F, the sacrificial material is formed at 16 to a thickness generally corresponding to a combined thicknesses of a subsequently formed epitaxial silicon material and the silicide structure. As described below, the sacrificial material is removed at 24 following sidewall spacer formation at 22, leaving a recessed area at the top of the patterned gate structure. In this regard, the initial formation thickness of the sacrificial material at 16 generally corresponds to the recess depth, depending on the removal process selectivity to the underlying gate contact material and the sidewall spacer material.

In accordance with the invention, all or portions of subsequently formed silicide and optional epitaxial silicon are formed in the recess in order to mitigate or avoid silicide bread-loafing and/or epitaxial polysilicon mushrooming and the disadvantages associated therewith. In this regard, the sacrificial material thickness may be any value, wherein any thickness may result in reduction of silicide bread-loafing and/or epitaxial polysilicon mushrooming. However, sizing the sacrificial material thickness at 16 according to the subsequent silicide and/or epitaxial growth processes may facilitate precise control over the improvements with respect to silicide bread-loafing and/or epitaxial polysilicon mushrooming. Thus, the invention contemplates controlling the material formation at 16 in order to tailor the resulting gate structure to achieve any desired amount of remaining recess after silicidation or any allowable overflow of silicide and/or epitaxial silicon. In one particular case illustrated below, the sacrificial SiGe material is formed at 16 to a thickness such that formation of the gate silicide structure substantially fills the recess of the gate structure.

Following formation of the sacrificial material layer at 16, the sacrificial material and the polysilicon gate contact layer are patterned at 18 to define a gate structure. The gate patterning at 18 may be performed according to any suitable photolithographic masking and material removal techniques, such as etching or others, by which a desired gate structure is formed over a channel region of the underlying semiconductor body, wherein prospective source/drain regions of the substrate outlying the channel are exposed. One or more lightly-doped drain (LDD) implants may then be performed at 20, using the patterned gate structure as an implantation mask, and sidewall spacers are then formed at 22 along the lateral sidewalls of the patterned gate structure. Any suitable materials and processing steps may be employed at 22 to form the sidewall spacers, for example, oxide, nitride, oxynitride, or other materials, wherein the sidewall spacers may be formed as a multi-layer structure having a lateral spacer thickness controlled according to a particular final transistor design.

At 24, all or a portion of the sacrificial material is removed from the patterned gate structure using any suitable material removal techniques. Removal of the sacrificial material at 24 exposes the underlying gate polysilicon and provides a recess in the patterned gate structure between upper ends of the sidewall spacers. In the exemplary implementation using SiGe as the sacrificial material, the wafer is wet etched at 24 using a mixture of $NH_4OH$, $H_2O_2$, and $H_2O$ having volume ratios of 1:1:5 at about 65 degrees C, although other material removal processes can be employed within the scope of the invention. In this particular example, the inventors have found that suitable etch selectivity can be obtained to remove the sacrificial SiGe material at a higher rate than the sidewall spacers and the underlying gate polysilicon material. This etch selectivity facilitates control over the resulting recess thickness and hence the amount of bread-loafing and/or mushrooming for given silicide and epitaxial thicknesses. Following removal of the sacrificial material at 24, source/drain implants may be performed at 28 prior to silicide processing at 30, wherein the source/drain implants may selectively provide dopants of a given type to the source/drain regions of the semiconductor body and/or to the gate polysilicon. This implementation is illustrated below in FIGS. 2A–2H.

In another example (FIGS. 3A–3F below), a selective epitaxial growth is performed at 26 after removing the sacrificial material at 24, in which epitaxial silicon is selectively grown over the gate polysilicon. If desired for a particular transistor design, epitaxial silicon may be concurrently grown over the source/drain regions of the substrate at 26, so as to provide raised or elevated source/drains in the transistor. Elevated source/drain structures may be employed, for example, to provide more consumable silicon for the subsequent silicide processing and thereby to reduce the resistance of the transistor source/drain region. In particular, elevated source/drain structures may be advantageous with smaller and smaller junction transistor designs, wherein the reduction in the junction depth may lead to series resistance problems. Providing additional semiconductor material, such as raised epitaxial silicon material, over the source/drain regions of the substrate allows the provision of additional dopants therein. This extra doping reduces the source/drain resistance, wherein some or all of the epitaxial silicon at the source/drain, and also at the top of the gate structure, is consumed by the subsequent silicide processing at 30. However, as discussed above, absent the methods of the present invention, providing such epitaxial silicon may lead to mushrooming at the gate structure, wherein subsequent silicidation of silicon outlying the sidewall spacers may reduce process margin for forming the source/drain contacts.

Following the removal of the sacrificial material at 24 and the optional selective epitaxial growth at 26, the source/drain regions and the gate structure are implanted at 28 with appropriate dopants to form first and second source/drains on opposite lateral sides of the channel region of the semiconductor body, and also to render the gate polysilicon more conductive. Following the source/drain implants at 28, silicide processing is performed at 30 to form a silicide structure over semiconductor material in the recess of the gate structure, where source/drain silicide structures may concurrently be formed at 30 using a single silicide process. In one implementation, nickel is deposited at 30 over the wafer, and one or more thermal processes are performed to react the upper portions of the gate polysilicon and the source/drain substrate regions with the deposited nickel. An etch processors then performed to remove the remaining unreacted nickel and subsequent thermal processing may be employed to complete the silicide structures over the gate and source/drains. Backend processing is then performed at 32 to complete the semiconductor product, for example, including forming a multi-level interconnect structure before the method 2 ends at 34.

Figure 2A:
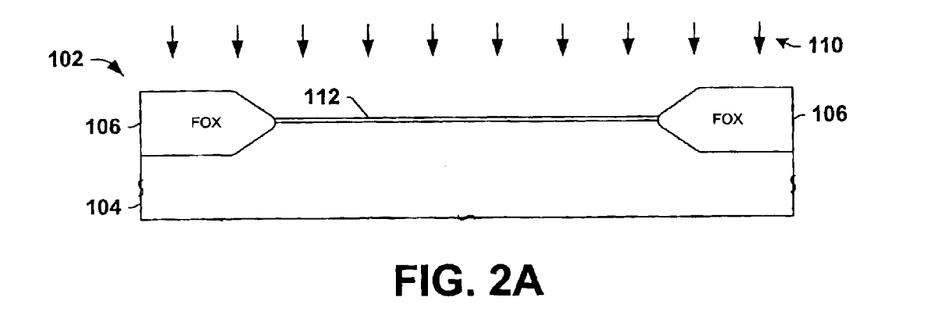
FIGS. 2A–2H are partial side elevation views in section illustrating formation of an exemplary MOS transistor in accordance with the invention.
Figure 2B:
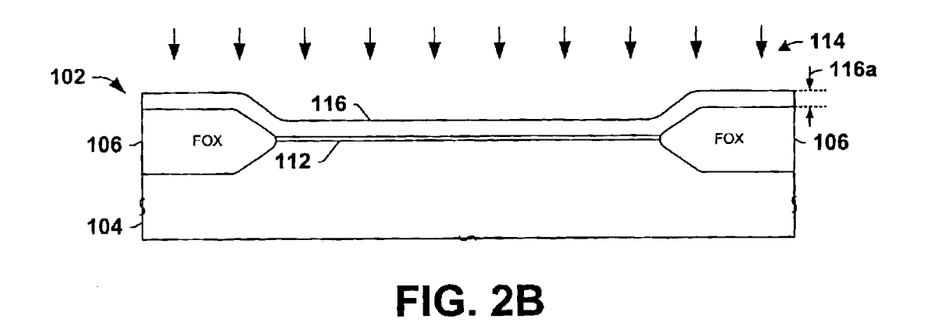
Figure 2C:
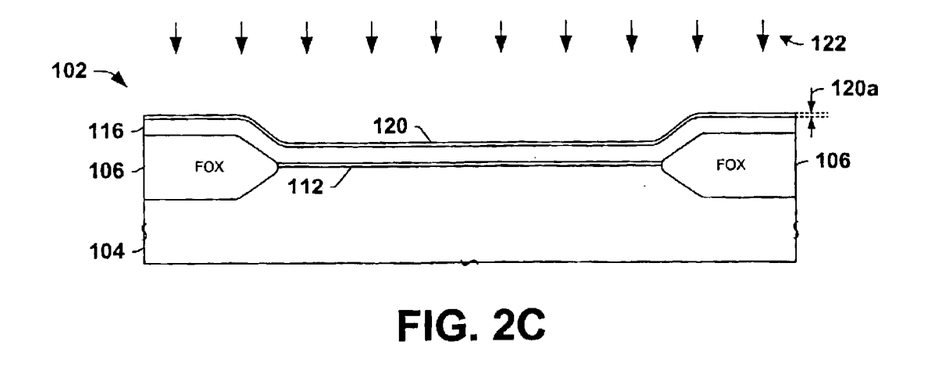

FIGS. 2A–2H illustrate an exemplary MOS transistor device 102 at various stages of fabrication in accordance with the invention, wherein the techniques of the present invention may be used in fabricating PMOS and/or NMOS transistors and gate structures therefor, and wherein the device 102 is not necessarily drawn to scale. In FIG. 2A, the device 102 is illustrated following isolation processing wherein field oxide (FOX) isolation structures 106 are formed to provide isolation between active regions of a semiconductor body 104, which may be a silicon substrate or silicon-over-insulator (SOI) wafer. A thermal oxidation process 110 is performed to create a thin gate dielectric layer 112 over the active regions of the semiconductor body 104. In FIG. 2B, a CVD deposition process 114 is employed to form a polysilicon layer 116 to a thickness 116a of about 900 Å in the illustrated device 102. In FIG. 2C, a sacrificial layer of SiGe 120 is formed via a CVD process 122 to a thickness 120a of about 100 Å. In one implementation, the SiGe layer 120 is formed using the same process 114 used to form the polysilicon 116, with the addition of Ge into the process gas to form the sacrificial material 120.

Figure 2D:
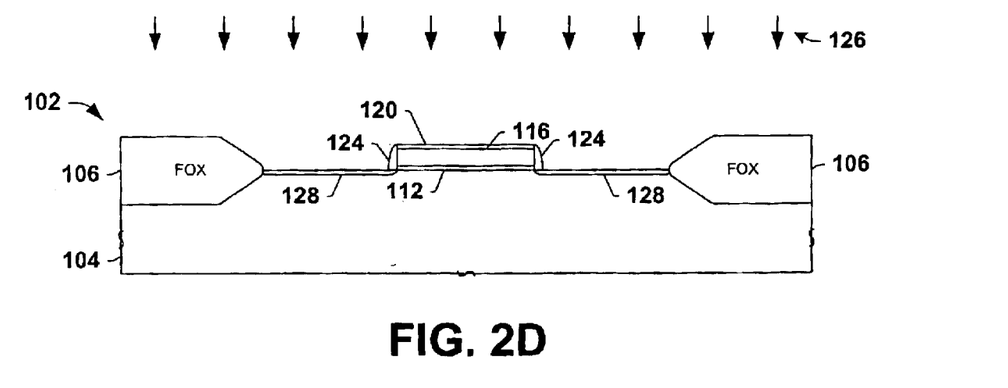
Figure 2E:
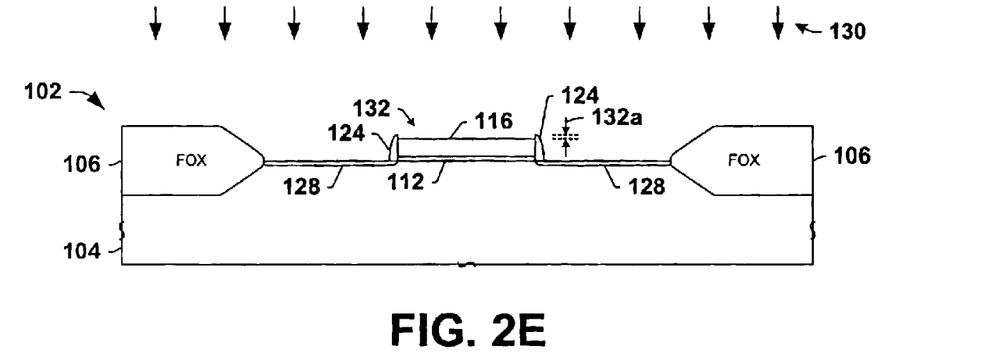
Figure 2F:
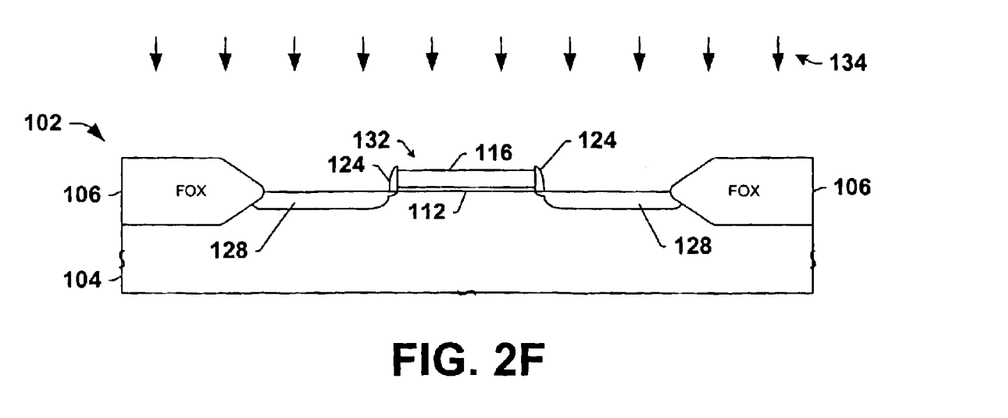

The sacrificial layer 120 and the polysilicon 116 are then patterned to define a gate structure as illustrated in FIG. 2D, wherein the gate dielectric 112 or portions thereof may also be removed. An LDD implantation process 126 is performed, which provides n or p type dopants to source/ drain regions 128 outlying a channel region of the semiconductor body 104. Sidewall spacers 124 are then formed along the lateral sidewalls of the patterned gate structure, which may be a single layer of oxide or nitride or combinations or multi-layered stacks thereof. An etch process 130 (e.g., wet etch) is then performed in FIG. 2E to remove the sacrificial SiGe material 120, leaving a recess 132 in the gate structure between upper ends of the sidewall spacers 124, wherein the recess 132 has a depth 132a of about 100 A generally corresponding to the deposition thickness 120a of the removed SiGe material 120. In FIG. 2F, a source/drain implantation process 134 is employed to provide further dopants to the source/drain regions 128, as well as to implant the exposed gate polysilicon 116.

Figure 2G:
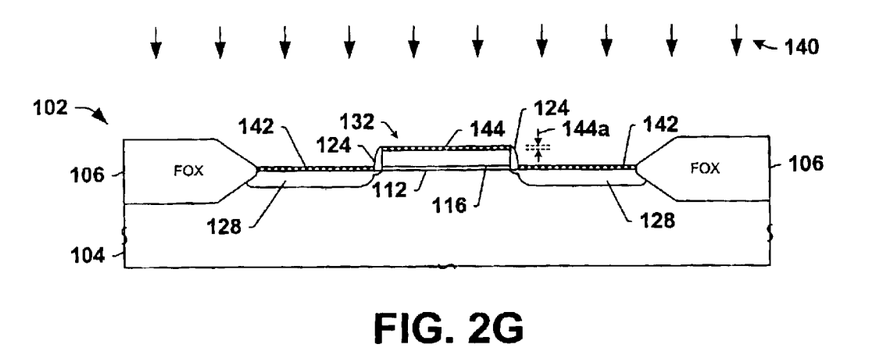
Figure 2H:
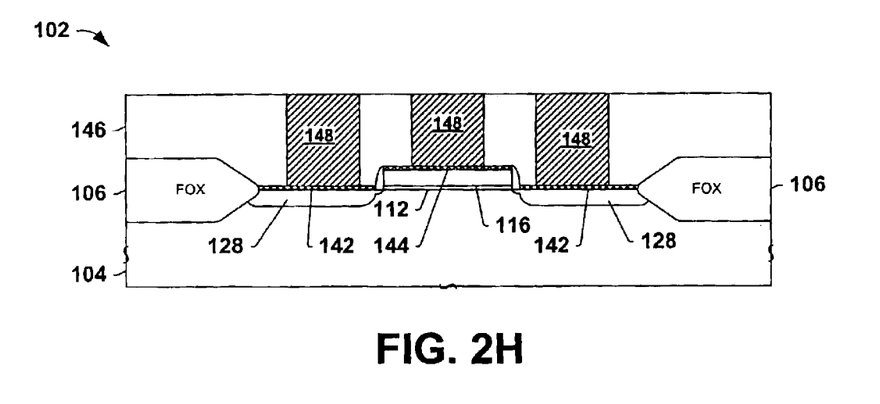

Referring now to FIG. 2G, a silicide process 140 is employed to form silicide structures 142 and 144 over the source/drain regions 128 of the semiconductor body 104 and the gate polysilicon 116, respectively. The gate silicide 144 is formed to a thickness 144a roughly equal to the recess depth 132a (FIG. 2E) in the exemplary device 102 to substantially fill the recess 132. Other implementations are possible, for example, where the suicide 144 does not fill the entire gate structure recess 132 or where some amount of silicide bread-loafing or lateral volumetric expansion exists, and all such variations are contemplated as falling within the scope of the invention and the appended claims. In the exemplary implementation of the device 102, however, the deposition thickness of the sacrificial SiGe material 120 is tailored to account for the subsequent silicide thickness and any marginal reduction in the sidewall spacer height or overetch of the polysilicon 116 during sacrificial material removal, in order to generally provide a substantially filled gate structure recess with little or no bread-loafing. It this regard, the provision of the recess 132 of any depth 132a may reduce or mitigate the amount of bread-loafing. Following the silicide process 140, various back-end interconnect structures are formed, including an initial interlayeror interlevel dielectric (ILD) material 146 through which conductive (e.g., tungsten) contacts 148 are formed to provide for electric connection to the silicided gate and source/ drains.

Figure 3A:
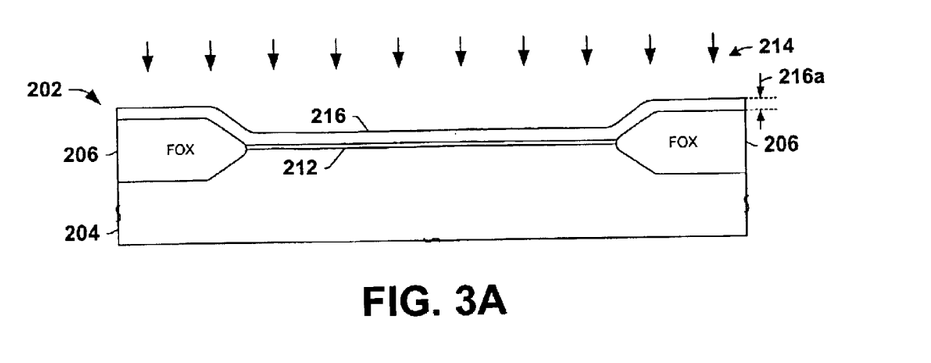
FIGS. 3A–3F are partial side elevation views in section illustrating formation of another exemplary MOS transistor in accordance with the invention.
Figure 3B:
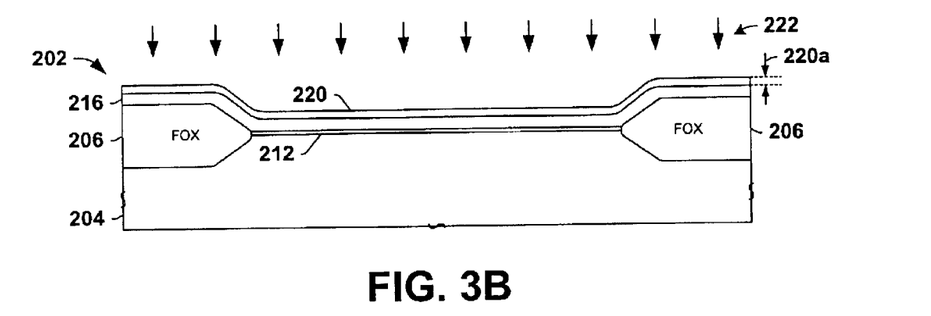
Figure 3C:
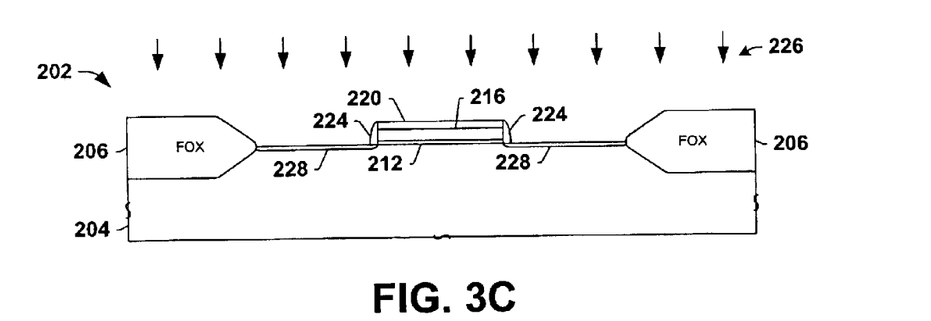

Another implementation of the present invention is illustrated in FIGS. 3A–3F, wherein a transistor device 202 is formed in an active region of a semiconductor body 204 between field oxide structures 206. In FIG. 3A, a gate dielectric layer 212 is formed over the active regions between the field oxide 206 and a polysilicon layer 216 is formed via a CVD deposition process 214 to a thickness 216a of about 700 Å in this example. In FIG. 3B, a sacrificial SiGe layer 220 is formed over the polysilicon 216 using a CVD process 222 to a thickness 220a of about 300 Å, wherein a single CVD process 214 alternatively may be employed to form the polysilicon 216 and the SiGe 220 by adding Ge gas into the process to form the sacrificial material 220. Referring now to FIG. 3C, the sacrificial layer 220 and the polysilicon 216 are then patterned to define a gate structure, and an LDD implantation process 226 provides dopants to source/drain regions 228 outlying a channel region of the semiconductor body 204, where the gate structure acts as an implantation mask. Sidewall spacers 224 are then formed along the lateral gate structure sidewalls.

Figure 3D:
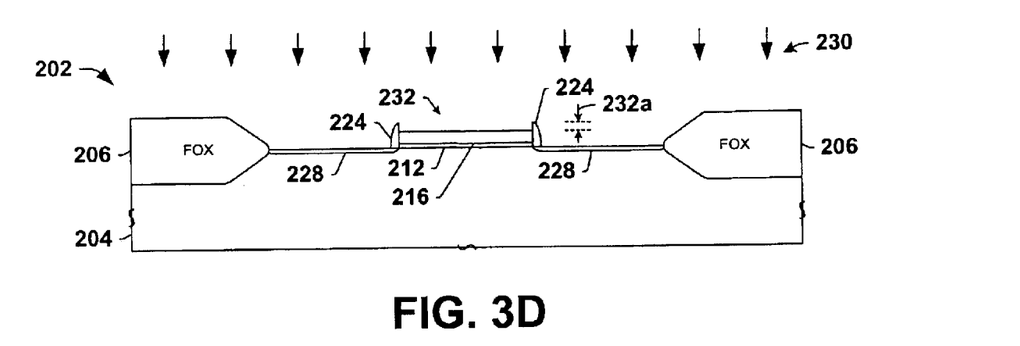
Figure 3E:
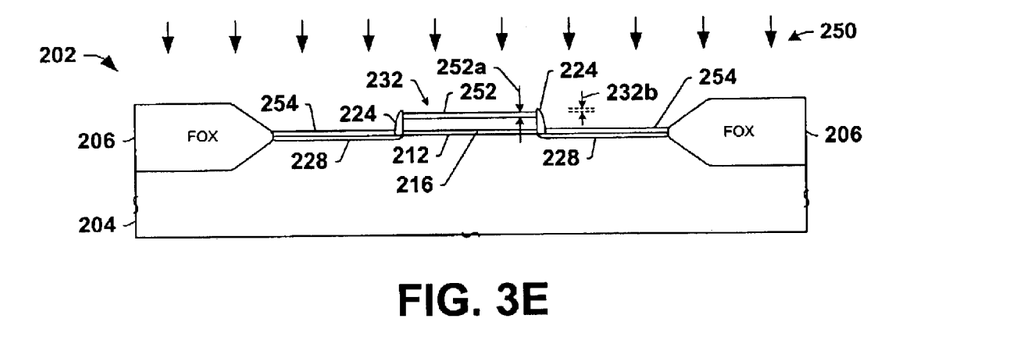
Figure 3F:
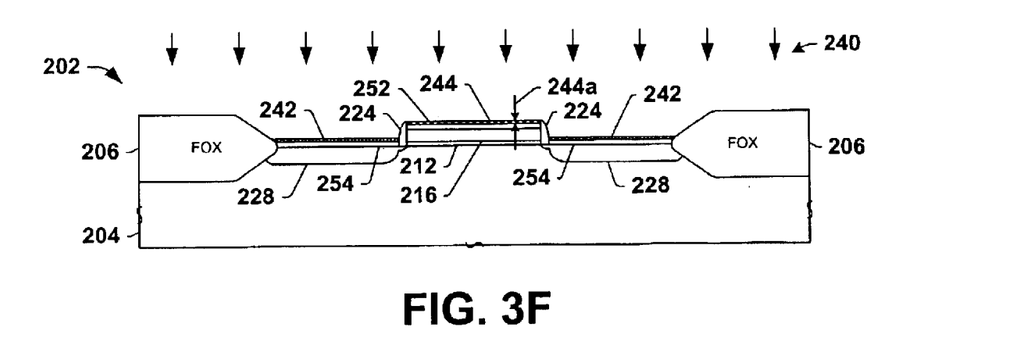

In FIG. 3D, a wet etch process 230, for example, is used to remove the sacrificial SiGe material 220, creating a recess 232 in the gate structure having a depth 232a of about 300 Å generally corresponding to the deposition thickness 220a of the removed SiGe material 220 (FIG. 3B). In FIG. 3E, a selective epitaxial growth process 250 is performed, wherein epitaxial silicon material 252 is selectively grown over the gate polysilicon to a thickness 252a of about 200 Å, and epitaxial silicon 254 is concurrently grown over the source/ drain regions 228. This leaves a portion of the recess 232 having a thickness 232b of about 100 Å. In FIG. 3F, a source/drain implantation is performed to implant the elevated source/drain regions 228 and the exposed gate structure. A silicide process 240 is then employed to form a gate silicide structure 244 over the gate structure and source/ drain silicide structures 242 over the source/drain regions 228 of the semiconductor body 204. In the exemplary device 102, the gate silicide 244 is formed to a thickness 244a roughly equal to the remaining recess depth 232b to thereby substantially fill the recess 232. As with the device 102 above, other implementations are possible, in which the silicide 244 does not fill the entire gate structure recess 232 or where silicide bread-loafing or lateral volumetric expansion exists, and all such variations are contemplated as falling within the scope of the present invention. Thereafter, various back-end processing is performed to create a multilayer interconnect structure (not shown) providing electric connection of the silicided gate and source/drains.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms used to describe such components (including a reference to a "means") are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a MOS transistor in a wafer, comprising:

forming a gate dielectric layer over a channel region of a semiconductor body;

forming a polysilicon layer over the gate dielectric layer;

forming a sacrificial material over the polysilicon layer;

patterning the sacrificial material and the polysilicon layer to define a gate structure;

forming at least one sidewall spacer along a lateral sidewall of the patterned gate structure;

removing the sacrificial material from the patterned gate structure after forming the at least one sidewall spacer to expose at least a portion of the polysilicon and to provide a recess in the gate structure;

forming first and second source/drains on opposite lateral sides of the channel region; and forming a silicide structure having a thickness in the recess of the gate structure, the thickness roughly equal to the remaining recess depth thereby substantially fill the recess.

2. The method of claim 1, wherein forming the sacrificial material comprises forming SiGe over the polysilicon layer.

3. The method: of claim 2, wherein the sacrificial material comprises about 15–30% germanium.

4. The method of claim 2, wherein removing the sacrificial material comprises wet etching the wafer using a mixture of $NH_4OH$, $H_2O_2$, and $H_2O$.

5. The method of claim 2, further comprising growing epitaxial silicon material over the exposed polysilicon in the recess of the gate structure after removing the sacrificial material.

6. The method of claim 5, wherein the silicide structure is formed over the epitaxial silicon material in the recess of the gate structure.

7. The method of claim 5, wherein forming the first and second source/drains comprises implanting dopants into source/drain regions of the semiconductor body prior to forming the silicide structure.

8. The method of claim 5, wherein the sacrificial material is formed to a thickness generally corresponding to combined thicknesses of the epitaxial silicon material and the silicide structure.

9. The method of claim 1, further comprising growing epitaxial silicon material over the exposed polysilicon in the recess of the gate structure after removing the sacrificial material.

10. The method of claim 9, wherein the silicide structure is formed over the epitaxial silicon material in the recess of the gate structure.

11. The method of claim 9, wherein the sacrificial material is formed to a thickness generally corresponding to combined thicknesses of the epitaxial silicon material and the silicide structure.

12. A method of fabricating a MOS transistor in a wafer, comprising:

forming a gate dielectric layer over a channel region of a semiconductor body;

forming a gate contact layer over the gate dielectric layer;

forming a sacrificial material over the gate contact layer;

patterning the sacrificial material and the gate contact layer to define a gate structure;

forming at least one sidewall spacer along a lateral sidewall of the patterned gate structure;

removing the sacrificial material from the patterned gate structure after forming the at least one sidewall spacer to expose the gate contact layer and to provide a recess in the gate structure;

growing epitaxial silicon material over the exposed gate contact layer in the recess of the gate structure after removing the sacrificial material;

forming first and second source/drains on opposite lateral sides of the channel region; and forming a silicide structure having a thickness in the recess of the gate structure, the thickness roughly equal to the remaining recess depth thereby substantially fill the recess.

13. The method of claim 12, wherein forming the sacrificial material comprises forming SiGe over the gate contact layer.

14. The method of claim 12, wherein removing the sacrificial material comprises wet etching the wafer using a mixture of $NH_4OH$, $H_2O_2$, and $H_2O$.

15. The method of claim 12, wherein forming the first and second source/drains comprises implanting dopants into the source/drain regions as well as into the epitaxial silicon material prior to forming the silicide structure.

* * * * *